(12) United States Patent
Parr et al.

(10) Patent No.: US 8,560,109 B1
(45) Date of Patent: Oct. 15, 2013

(54) METHOD AND SYSTEM FOR BI-DIRECTIONAL COMMUNICATION BETWEEN AN INTEGRATED CIRCUIT (IC) LAYOUT EDITOR AND VARIOUS IC PATTERN DATA VIEWERS

(75) Inventors: Aaron A. Parr, Sandy, UT (US); Rodney Rigby, Riverton, UT (US); Cody Kyrobie, Orem, UT (US); Li-Chien Ting, Cupertino, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 13/372,945

(22) Filed: Feb. 14, 2012

Related U.S. Application Data

(63) Continuation of application No. 11/349,943, filed on Feb. 9, 2006, now abandoned.

(51) Int. Cl.
*G05B 15/00* (2006.01)
*G06F 3/00* (2006.01)
*G06F 9/44* (2006.01)
*G06F 15/177* (2006.01)
*G06F 17/50* (2006.01)
*G06F 19/00* (2011.01)
*G09G 5/00* (2006.01)

(52) U.S. Cl.
USPC .............. 700/121; 700/96; 700/97; 700/98; 700/83; 345/420; 345/619; 703/1; 715/733; 715/734; 715/735; 715/753; 715/965; 717/103

(58) Field of Classification Search
USPC ............. 700/121, 96–98, 83; 715/FOR. 227, 715/965, 753, 733–735; 717/103; 345/420, 345/619; 703/1
See application file for complete search history.

(56) References Cited

U.S. PATENT DOCUMENTS

| | | | | |
|---|---|---|---|---|
| 5,465,221 | A * | 11/1995 | Merat et al. | 702/83 |
| 5,980,093 | A * | 11/1999 | Jones et al. | 716/129 |
| 6,094,658 | A * | 7/2000 | Araki | 1/1 |
| 6,708,313 | B2 * | 3/2004 | Pfeil et al. | 716/102 |
| 7,069,192 | B1 * | 6/2006 | Freitag | 703/1 |
| 7,176,942 | B2 * | 2/2007 | Chartier et al. | 345/619 |
| 7,188,072 | B2 * | 3/2007 | Eichstaedt et al. | 705/7.11 |
| 7,292,906 | B2 * | 11/2007 | Funk et al. | 700/121 |
| 8,028,275 | B2 * | 9/2011 | Eldridge et al. | 717/121 |
| 2002/0173867 | A1 * | 11/2002 | Duncan et al. | 700/97 |
| 2005/0015740 | A1 * | 1/2005 | Sawicki et al. | 716/11 |
| 2005/0160396 | A1 * | 7/2005 | Chadzynski | 717/103 |
| 2006/0238538 | A1 * | 10/2006 | Kapler et al. | 345/440 |
| 2008/0276184 | A1 * | 11/2008 | Buffet et al. | 715/752 |
| 2012/0041570 | A1 * | 2/2012 | Jones et al. | 700/17 |

* cited by examiner

*Primary Examiner* — Mohammad Ali
*Assistant Examiner* — Jennifer L Norton
(74) *Attorney, Agent, or Firm* — Rosenberg, Klein & Lee

(57) ABSTRACT

Various embodiments of the present invention relate to bi-directional communication between an Integrated Circuit (IC) layout editor and various generic layout and/or pattern data viewers. Further, the present invention provides a bi-directional control between the IC layout editor and the various generic layout and/or pattern data viewers and allows substantially simultaneous display of an IC design in various IC mask layout data formats. The IC layout editor and the various generic layout and/or pattern data viewers include various tools. The bi-directional communication connects these tools to form connected tools. Subsequently, the actions performed by a connected tool in response to user interactions are synchronized with the actions performed by other connected tools.

20 Claims, 5 Drawing Sheets

METHOD AND SYSTEM FOR BI-DIRECTIONAL COMMUNICATION BETWEEN AN INTEGRATED CIRCUIT (IC) LAYOUT EDITOR AND VARIOUS IC PATTERN DATA VIEWERS

RELATED U.S. APPLICATION DATA

Continuation of U.S. application Ser. No. 11/349,943, filed 9 Feb. 2006.

BACKGROUND OF THE INVENTION

The present invention relates to Integrated Circuit (IC) layouts. More particularly, the present invention relates to bi-directional communication between an IC layout editor and various generic layout and/or pattern data viewers.

An IC layout, also known as IC mask layout, represents an IC in terms of planar geometric shapes. These planar geometric shapes correspond to the shapes actually drawn on photo masks used in semiconductor device fabrication. The IC layout may be created by automatic Electronic Development Automation (EDA) tools. By way of example, EDA tools may include place and route tools and schematically driven layout tools. The IC layout can also be created and edited manually by an IC designer. By way of example, the IC designer can create and edit the IC layout by means of an IC layout editor.

The IC layout results in the representation of the IC in various IC mask layout data formats. By way of example, the IC mask layout data formats can be stored in a GDSII database format, a MEBES database format, or an OASIS database format. These IC mask layout data formats involve a binary format for the representation of planar geometric shapes, text labels, and other information in a hierarchical manner. Further, the IC layout editor involves final physical implementation of an IC design that is controlled through human modification. The IC layout editor generates a database, referred to as a layout database that forms a baseline of the IC design. The implementations of the IC design that are in the IC mask layout data format are compared with the baseline.

Further, the IC design flow for the various IC mask layout data formats implies the need to work with different IC mask layout data formats during failure analysis and verification of the IC design. By way of example, while ascertaining the root cause of a production failure, data from each stage of the IC design flow must be compared to the baseline for determining the cause of the failure.

Several conventional methods have been used for comparing the data in IC mask layout data formats with the baseline. One such method involves converting the data in the IC mask layout data formats back into the original IC layout database and subsequently, viewing the converted data through distinct editors. Since equipment formats (input data formats proprietary to the machines that are used to realize an IC layout and to which the IC layout must be converted during the mask or wafer manufacturing process) are often flat while the layout databases are generally hierarchical, conversion of a flat database to a hierarchical database tends to overwhelm the layout editor. The layout editor is generally not tuned for handling these flat databases.

Such a conversion can also result in information loss since the capabilities of different layout databases may be different from the storage capabilities of the equipment formats and the transport formats (any design format used to transport or transfer a design representation between two places, tools, or people—an equipment format or a layout format can serve as a transport format). Examples include but are not limited to stripe and segment boundaries, address unit snapping, field polarity for machine formats as well as circle approximations, and trapezoid representations for the IC mask layout data formats. As a result, these incompatibilities lead to information loss. Further, this information loss could result in incorrect representation of the IC design. Moreover, the information loss may impair a user's ability to efficiently inspect the data in comparison with a tool that can display the transport or equipment formats. Therefore, conversion of the data back to the original layout database involves information loss and requires more data storage capacity, and impedes the capability to make valid comparisons.

An attempt to address this problem of information loss and requirement of more data storage capacity has been made. This attempt involves viewing the layout database in the layout editor and examining alternate representations in general-purpose viewers. These general-purpose viewers can be various generic pattern data viewers. These various generic pattern data viewers are free from the information loss problems of conversion and do not require more data storage capacity. However, the actions performed in one program are not reflected by the other programs. By way of example, panning and zooming in one program does not cause pan and zoom in the other programs. As a result, the user needs to manually synchronize the viewing windows of the programs. Further, when comparing specific details about each database, the operations used to extract the information must also be repeated for each of the programs. By way of example, IC measurements and object property queries must be performed separately in the layout editor and each of the separate pattern viewers. Furthermore, either one user must learn how to use the various programs or separate users, each skilled to use one program, need to collaborate in order to view the IC design in multiple representations.

In light of the foregoing discussion, a need exists for a method and system that provides a communication link between the IC layout editor and the generic layout and/or pattern data viewers. The present invention addresses such a need.

SUMMARY OF THE INVENTION

Aspects for bi-directional communication between an Integrated Circuit (IC) layout editor and various IC pattern data viewers include a communication channel between them. The IC layout editor and the various IC pattern data viewers include various tools. The communication channel connects these tools to form connected tools. Subsequently, the actions performed by a connected tool in response to user interactions are synchronized with the actions performed by the other connected tools. The bi-directional communication channel includes a controller. The controller manages and synchronizes the actions of the connected tools.

The present invention facilitates bi-directional communication between an IC layout editor and various IC pattern data viewers and allows a substantially simultaneous display of an IC design in various IC mask layout data formats. Such a communication channel eliminates the need for a single program to handle the various IC mask layout data formats. Further, the user is not required to learn how to use the various programs and tools within these programs for viewing multiple representations of a single IC design. As a result, the viewable region synchronization between the IC layout editor and the various IC pattern data viewers is enhanced. These and other advantages will be more fully appreciated in conjunction with the following detailed description and the accompanying drawings.

BRIEF DESCRIPTION OF THE DRAWINGS

Various embodiments of the present invention will hereinafter be described in conjunction with the appended drawings, provided to illustrate, and not to limit the present invention, wherein like designations denote like elements, and in which.

DESCRIPTION OF VARIOUS EMBODIMENTS

Various embodiments of the present invention relate to bi-directional communication between an Integrated Circuit (IC) layout editor and various generic layout and/or pattern data viewers. Further, the present invention provides bi-directional control between the IC layout editor and the various generic layout and/or pattern data viewers and allows a substantially simultaneous display of an IC design in various IC mask layout data formats. The IC layout editor and the various IC pattern data viewers include various tools. The bi-directional communication connects these tools to form connected tools. Subsequently, the actions performed by a connected tool in response to user interactions are synchronized with the actions performed by the other connected tools. Connected tools may include but are not limited to measuring tools, panning and zooming tools, data hierarchy management tools, layer visibility, and control tools.

Figure 1:
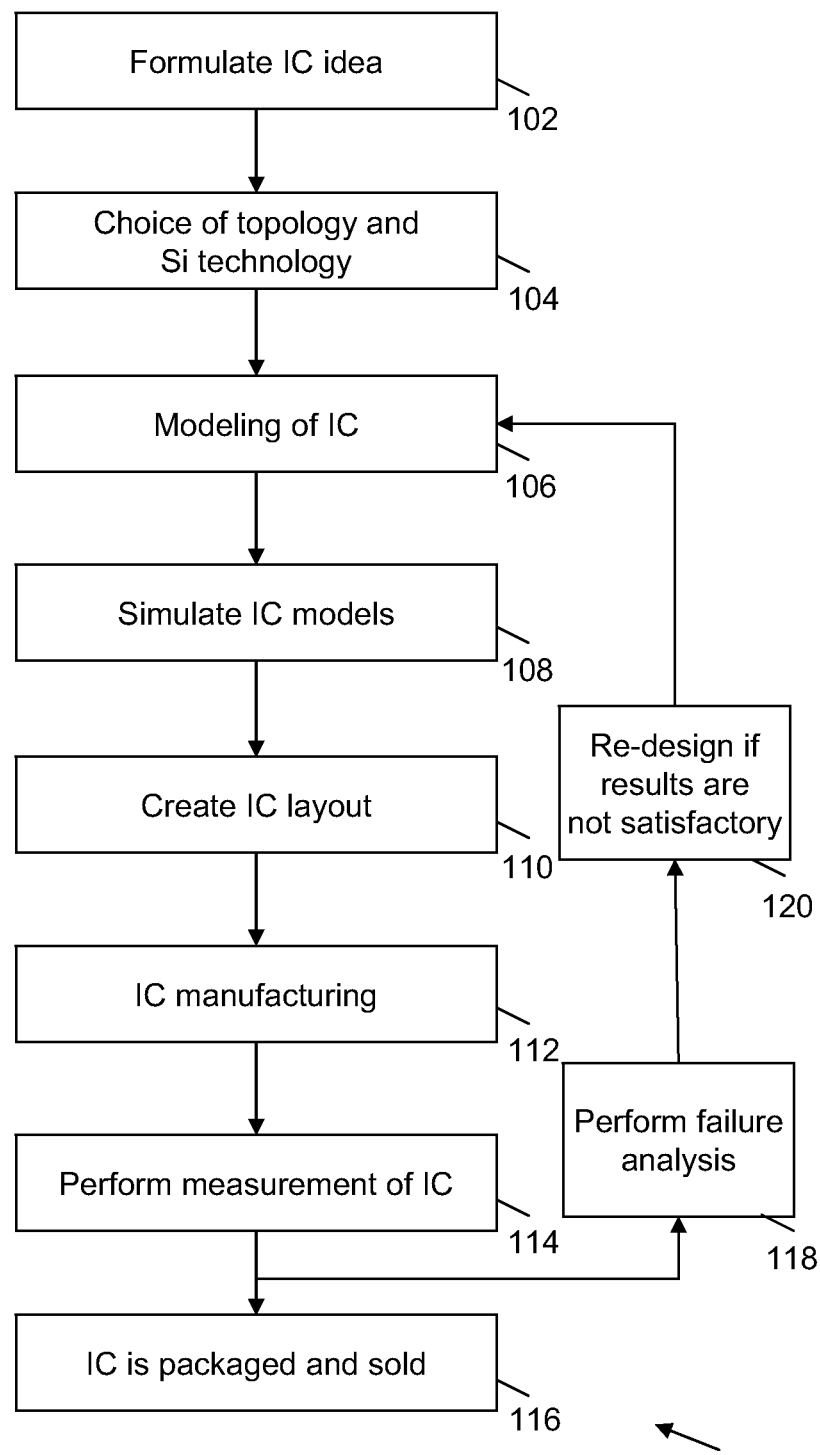
FIG. 1 illustrates an Integrated Circuit (IC) design flow, in accordance with an embodiment of the present invention.

FIG. 1 illustrates an IC design flow 100, in accordance with an embodiment of the present invention. IC design flow 100 includes various steps that are involved in the designing of an IC. The IC idea is formulated at act 102. By way of example, an IC designer formulates the IC idea as per the requirement and the applicability of the IC to be designed. Once the idea for the IC is formulated, at act 104, the IC designer chooses the topology and Silicon (Si) technology. At act 106, the IC is modeled. Various IC model libraries can be used for the IC modeling to be performed. Subsequently, at act 108, the IC models are simulated. These simulations are performed using the models present in the IC model libraries. By way of example, the IC designer can perform high-speed, cycle-by-cycle simulations using the various IC libraries.

At act 110, the IC layout is created. The IC layout, also referred to as an IC mask layout, is a representation of the IC in terms of planar geometric shapes. Such shapes correspond to the shapes actually drawn on photo masks that are used in semiconductor device fabrication. Further, the IC layout results in the representation of the IC in various IC mask layout data formats. By way of example, the IC mask layout data formats can be, but are not limited to, a GDSII database format, a MEBES database format, and/or an OASIS database format. These layout formats involve the binary format for the representation of the planar geometric shapes, text labels, and other information in a flat or hierarchical manner. Further, the IC layout includes a layout editor. The layout editor generates a database, referred to as a layout database. The layout database is considered as a baseline of the IC design, against which the implementations of the IC design that are in the IC mask layout data format are compared. The IC mask layout data format can be viewed through a viewer, referred to as a generic viewer or an IC pattern data viewer. The linking of the layout editor and the various IC pattern data viewers is described in conjunction with the FIGS. 2, 3, and 4.

At act 112, the IC is manufactured. Subsequently, at act 114, the measurement of the IC is performed. If the results are satisfactory, then, at act 116, the IC is packaged and sold. However, if the results are not satisfactory, then, at act 118 failure analysis is performed (often by reviewing several formats of the design data) to determine the root cause of any performance issues. Further at act 120, the IC is re-designed. Subsequently, the re-designed IC is modeled at act 106 and the acts 108-120 are repeated unless the results are satisfactory.

Figure 2:
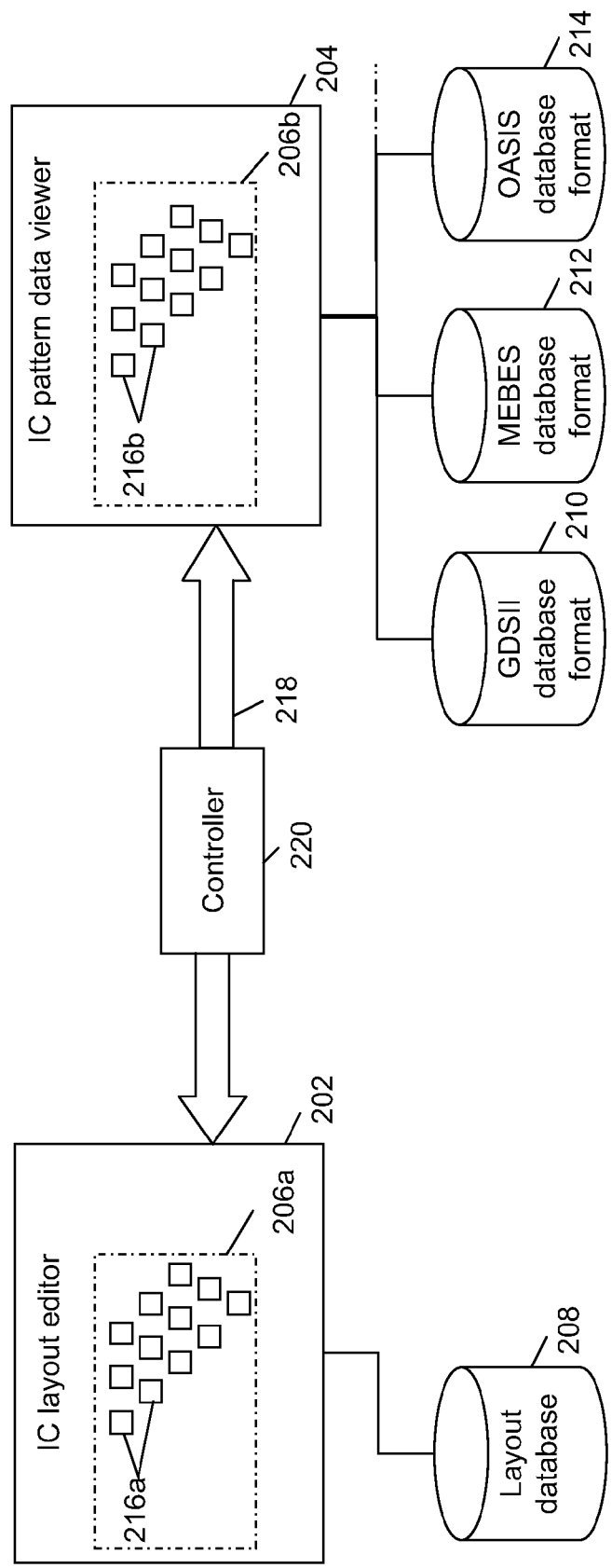
FIG. 2 illustrates various elements for bi-directional communication between an IC layout editor and various IC pattern data viewers, in accordance with an embodiment of the present invention.

FIG. 2 illustrates various elements for bi-directional communication between an IC layout editor 202 and an IC pattern data viewer 204, in accordance with an embodiment of the present invention. IC layout editor 202 includes a collection of tools 206a, which includes connected tools 216a, and a layout database 208. IC pattern data viewer 204 includes a collection of tools 206b, which includes connected tools 216b, and various IC mask layout data formats, including but not limited to, GDSII database format 210, a MEBES database format 212, and an OASIS database format 214. The illustration only shows a connection between two programs for the sake of simplicity. The invention is intended to allow simultaneous connection between multiple layout editors and pattern viewers that display multiple data formats.

Layout database 208 provides a baseline to the IC design. Further, the design specifications of the IC for each of the transport or machine formats, including but not limited to GDSII database format 210, MEBES database format 212, and OASIS database format 214, are compared with the baseline. Consequently, there is bi-directional flow of information between IC layout editor 202 and IC pattern data viewer 204. This results in a substantially simultaneous display of the IC design in various IC mask layout data formats. The bi-directional communication has been described further herein below. Such a bi-directional communication connects tools 216a and 216b to form connected tools. The connected tools can respond to user interactions. This is described in conjunction with FIG. 4.

In accordance with an embodiment of the present invention, the user selects tools from collections of tools 206a and 206b to form connected tools 216a and 216b, IC mask layout data formats, and a combination thereof. By way of example, bi-directional communication between IC layout editor 202 and IC pattern data viewer 204 can include a startup mechanism for the user to select connected tools 216, the IC mask layout data formats, and a combination thereof. By way of example, initial global adjustments necessary to achieve data coordinate space parity (rotation, mirroring, and offsetting) could be user-entered or automatically derived.

IC layout editor 202 and IC pattern data viewer 204 are linked through a communication channel 218. Communication channel 218 provides bi-directional communication between IC layout editor 202 and IC pattern data viewer 204. Communication channel 218 connects tools from collection of tools 206 to form connected tools 216.

Further, communication channel 218 includes a controller 220. Controller 220 manages the communication of the actions of connected tools 216. The actions of a connected tool 216a in response to the user interactions are either due to a direct-user input message or messages from other connected tools 216b. Communication channel 218 connects tools 216 and combines them into a single environment. Further, bi-directional communication between IC layout editor 202 and IC pattern data viewer 204 includes a Mutual-exclusion object (MUTEX). The MUTEX prevents simultaneous updates of connected tools 216, as would be apparent to a person ordinarily skilled in the art. This is further described in conjunction with FIG. 3.

In accordance with an embodiment of the present invention, controller 220 can be present in one of connected tools 216 to form a master tool. In accordance with another embodiment of the present invention, controller 220 can be present in each of connected tools 216 distributing the responsibility of message translation throughout system 200. In accordance with another embodiment of the present invention, controller 220 can be present externally, to connected tools 216 through which all communication must pass through.

In accordance with an embodiment of the present invention, collection of tools 206 notify controller 220 to connect them and form connected tools 216.

In accordance with another embodiment of the present invention, controller 220 notifies connected tools 216 that they are connected to each other through communication channel 218.

Figure 3:
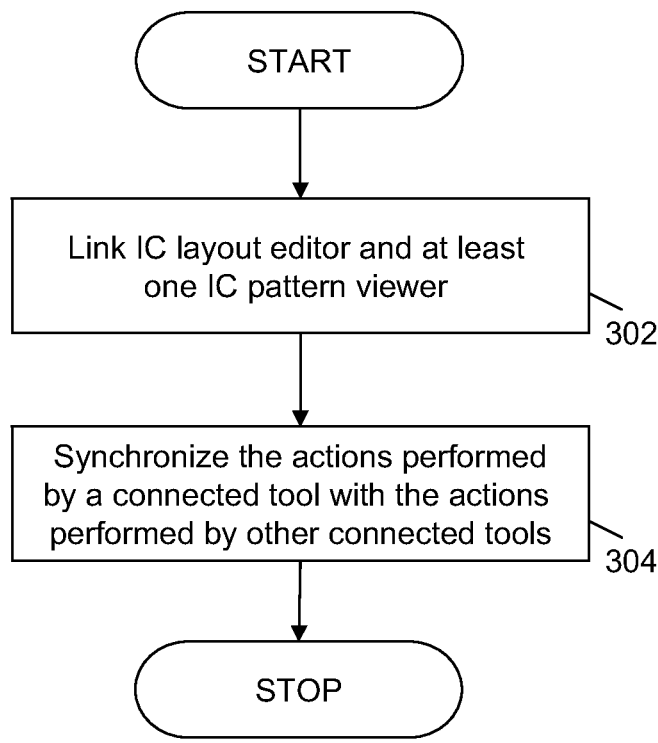
FIG. 3 illustrates a flowchart, depicting the requisite steps for bi-directional communication between an IC layout editor and various IC pattern data viewers, in accordance with an embodiment of the present invention.

FIG. 3 illustrates a flowchart, depicting the requisite steps for bi-directional communication between IC layout editor 202 and IC pattern data viewer 204, in accordance with an embodiment of the present invention. At act 302, IC layout editor 202 and IC pattern data viewer 204 are linked. The link provided between them is bi-directional. Further, bi-directional communication between them includes the MUTEX. The MUTEX prevents simultaneous updates of connected tools 216. By way of example, connected tool 216a that is receiving messages from other connected tools 216b may need to remain silent with regard to the changes made to the environment of connected tool 216a. The processing of the messages from connected tools 216b causes such changes. By remaining silent, connected tool 216 prevents a single user interaction from resulting in an unending cascade of message loops, which would ultimately overwhelm connected tools 216. As a result, the MUTEX prevents simultaneous updating of connected tools 216.

Connected tools 216 respond to the user interactions, as mentioned with reference to FIG. 2. The actions of connected tool 216a in response to the user interactions can be either due to direct-user input message or messages from connected tools 216b. The link provided at act 302 facilitates each of connected tools 216 to report the actions among themselves and respond accordingly. By way of example, connected tool 216a, upon receiving a message, responds appropriately to connected tools 216b. Such a communication can result in a number of different command synchronizations. At act 304, the actions performed by connected tool 216a are synchronized with the actions performed by connected tools 216b. As a result, the user can leverage unique functionality present in connected tool 216a across connected tools 216b. As mentioned earlier, controller 220 manages the communication related to the actions of connected tools 216. Act 304 has been further explained in detail in conjunction with FIG. 4.

Figure 4:
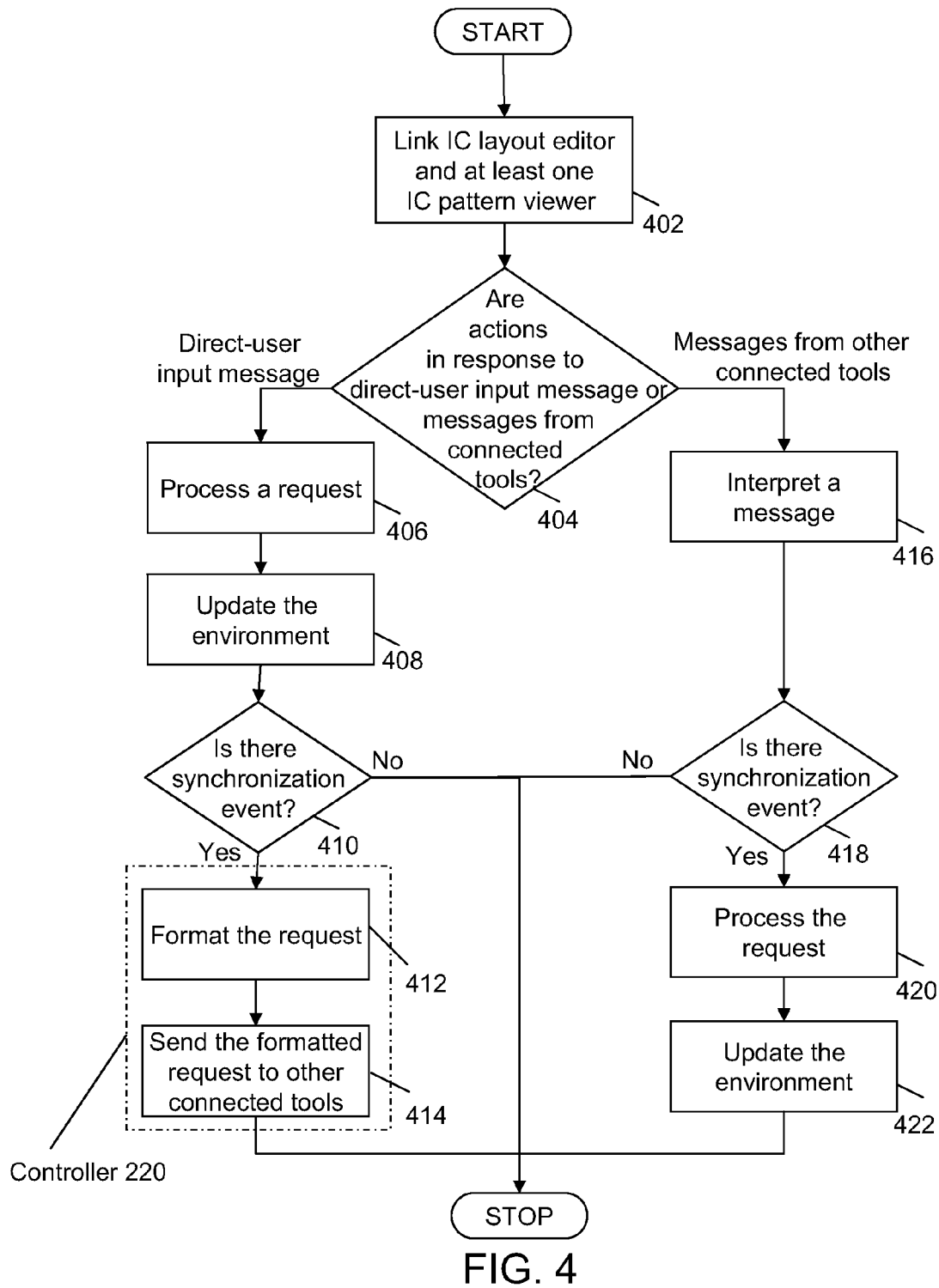
FIG. 4 illustrates a flowchart, depicting the detailed steps for bi-directional communication between an IC layout editor and various IC pattern data viewers, in accordance with an embodiment of the present invention.

FIG. 4 illustrates a flowchart, depicting the detailed steps for bi-directional communication between IC layout editor 202 and various IC pattern data viewers 204, in accordance with an embodiment of the present invention. At act 402, IC layout editor 202 and IC pattern data viewer 204 are linked. At act 404, it is checked whether the actions of connected tool 216a are in response to the direct-user input message or messages from connected tools 216b. If the actions of connected tool 216a are in response to the direct-user input message, then, at act 406, a request made by the user is processed. Subsequently, at act 408, the environment of connected tool 216a is updated. The environment is updated as if connected tool 216a was not connected. This means that the present invention relates to actions that are taken beyond the normal tool functionality. Examples of an environment update would include panning and zooming, performing an object property query, and changing a color. Further, an environment update includes any action performed by any tool within the layout editor or the data pattern viewer.

At act 410, it is checked whether the actions of connected tool 216a, in response to the direct-user input message, result in a synchronization event, such as panning and zooming, feature measurements, geometry property selection, and other functions. If they result in a synchronization event, then, at act 412, the request is formatted. It is at this point where controller 220 takes over. It is the responsibility of controller 220 to interpret, reformat, and ultimately send (act 414) the request from connected tool 216a for connected tool 216b to respond. For example, consider that connected tool 216a is within the Virtuoso layout editor which uses the SKILL language for the coordination of its internal tools and connected tool 216b is within the QuickView pattern viewer which uses the QUEL language for the coordination of its internal tools. In this case, when connected tool 216a intends to request that connected tool 216b act or update its environment, the request from connected tool 216a is ultimately formatted as a SKILL message. It is the job of controller 220 to translate the SKILL message into a QUEL message, which can be understood and interpreted by connected tool 216b. The methods for translation, would be apparent to a person ordinarily skilled in the art. Connected tool 216b can then act accordingly. Once the request is formatted, at act 414, the formatted request is sent to connected tools 216b. The request is interpreted, based on the message language understood by connected tools 216b.

However, if the actions of connected tool 216a are in response to a message from connected tool 216b, then, at act 416, the message sent from connected tool 216b is interpreted. At act 418, it is checked whether the actions of connected tool 216a, in response to the message from connected tool 216b, result in a synchronization event. If they result in a synchronization event, then, at act 420, a request made by connected tool 216b is processed. Subsequently, at act 422, the environment of connected tool 216a is updated.

In accordance with an embodiment of the present invention, controller 220 processes and re-formats (if connected tools 216b requires a different message format from that provided by a requesting tool) the request by connected tools 216a and transmits the re-formatted messages to connected tools 216b. Consequently, controller 220 manages the communication between connected tools 216 allowing similar tools in dissimilar programs to interact. Further, controller 220 establishes the connection and the communication between connected tools 216.

In accordance with an embodiment of the present invention, as the user interacts with a connected tool 216, any supported synchronization action is automatically sent to other connected tools 216 through communication channel 218. By way of example, if a connected tool 216a interacts with the user, then connected tool 216a can send messages to connected tools 216b. By way of example, connected tool 216a may request connected tool 216b to synchronize pan and zoom, feature measurements, geometry property selection, and other functions.

Figure 5:
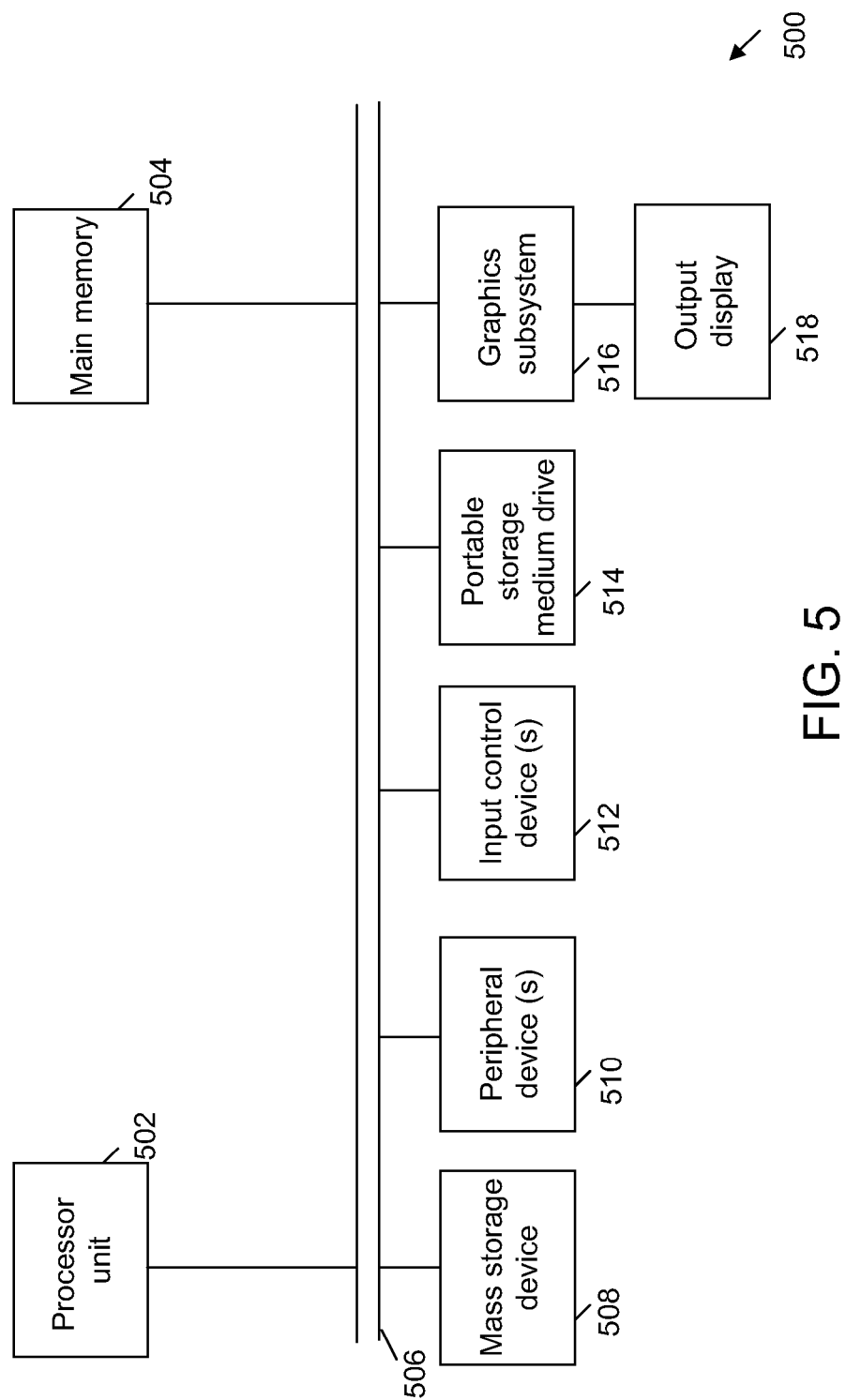
FIG. 5 illustrates a block diagram of a general-purpose computer system to execute the method for bi-directional communication between an IC layout editor and various IC pattern data viewers, in accordance with various embodiments of the present invention.

FIG. 5 illustrates a block diagram of a general-purpose computer system, to execute the method for bi-directional communication between IC layout editor 202 and IC pattern data viewer 204, in accordance with various embodiments of the present invention.

A computer system 500 contains a processor unit 502, a main memory 504, an interconnect bus 506, a mass storage device 508, a peripheral device(s) 510, an input control device (s) 512, a portable storage medium drive(s) 514, a graphics subsystem 516, and an output display 518. Processor unit 502 can include a single microprocessor or a plurality of microprocessors for configuring computer system 500 as a multi-processor system. Main memory 504 stores, in part, instructions and data to be executed by processor unit 502. Main memory 504 can include banks of dynamic random access memory (DRAM) as well as high-speed cache memory.

For the purpose of simplicity, all the components of computer system 500 are connected via interconnect bus 506. However, computer system 500 may be connected through one or more data transport means. By way of example, processor unit 502 and main memory 504 may be connected via a local microprocessor bus; and mass storage device 508, peripheral device(s) 510, portable storage medium drive(s) 514, and graphics subsystem 516 may be connected via one or more input/output (I/O) buses. Mass storage device 508, which can be implemented with a magnetic disk drive or an optical disk drive, is a non-volatile storage device for storing data and instructions, to be used by processor unit 502. In the software embodiment, mass storage device 508 stores the software, to load it to main memory 504.

Portable storage medium drive 514 operates in conjunction with a portable non-volatile storage medium, such as a floppy disk or a compact disc read only memory (CD-ROM), to input and output data and code to and from computer system 500. In one embodiment, the software is stored on such a portable medium, and is input to computer system 500 via portable storage medium drive 514. Peripheral device(s) 510 can include any type of computer support device such as an input/output (I/O) interface, to add additional functionality to computer system 500. By way of example, peripheral device(s) 510 can include a network interface card, to interface computer system 500 to a network.

Input control device(s) 512 provide a portion of the user interface for a computer system 500 user. Input control device (s) 512 may include an alphanumeric keypad for inputting alphanumeric and other key information; a cursor control device such as a mouse, a trackball or stylus; or cursor direction keys. In order to display textual and graphical information, computer system 500 contains graphics subsystem 514 and output display 518. Output display 518 may include a cathode ray tube (CRT) display or liquid crystal display (LCD). Graphics subsystem 516 receives textual and graphical information, and processes the information for output-to-output display 518. The components of computer system 500 are those that are typically found in general-purpose computer systems, and, in fact, these components are intended to represent a broad category of such computer components that are well known in the art.

For software implementation, the software for bi-directional communication between IC layout editor 202 and IC pattern data viewer 204 includes a plurality of computer executable instructions, to be implemented on a general-purpose computer system. Prior to loading it into a general-purpose computer system, the software bi-directional communication between IC layout editor 202 and IC pattern data viewer 204 may reside as encoded information on a computer-readable medium such as a magnetic floppy disk, a magnetic tape or a compact disc read only memory (CD-ROM). In one hardware implementation, the software bi-directional communication between IC layout editor 202 and IC pattern data viewer 204 may comprise a dedicated processor comprising processor instructions for performing the functions described herein. Circuits may also be developed to perform these functions.

A system, as described in the present invention or any of its components, may be embodied in the form of a computer system. Typical examples of a computer system include a general-purpose computer, a programmed microprocessor, a micro-controller, a peripheral IC element, and other devices or arrangements of devices that are capable of implementing the acts of the present invention, including a computer readable medium having computer readable program code embodied therein, as is well understood in the art.

Various embodiments of the present invention relate to bi-directional communication between an IC layout editor and various IC pattern data viewers. The IC layout editor and the various pattern data viewers include various tools. The bi-directional communication is achieved through a communication channel. The communication channel connects the tools to form connected tools. Such a communication channel includes a controller. The controller manages communication between the connected tools allowing them to synchronize their actions.

Various embodiments of the present invention eliminate the need for a single tool for handling the various IC mask layout data formats. This is achieved by connecting the various tools and combining them into a single environment.

Various embodiments of the present invention provide a substantially simultaneous display of an IC design in various IC mask layout data formats. Consequently, this enhances the viewable region synchronization between the IC layout editor and the various IC pattern data viewers.

Various embodiments of the present invention provide bi-directional communication between the IC layout editor and the various IC pattern data viewers in a more efficient and productive manner. This is achieved by synchronizing the actions of a connected tool with the actions of the other connected tools.

Various embodiments of the present invention provide a system that has the ability to work with different IC mask layout data formats. This eliminates the requirement to translate the details of the IC design from one IC mask layout data format to the other. Further, various embodiments of the present invention facilitate the user to leverage unique functionality present in a connected tool across all the other connected tools.

In accordance with an embodiment of the present invention, the user is not required to have a comprehensive knowledge of how to operate each of the various tools for viewing multiple representations of a single IC design.

In accordance with an embodiment of the present invention, the communication channel can be used to link an editor or viewer for layout databases with viewers associated with manufacturing equipment. By way of example, the manufacturing equipment could be a scanning electron microscope, a wafer map machine, an IC test machine, or other reticle, mask, wafer manufacturing, or test equipment.

While the preferred embodiments of the present invention have been illustrated and described, it will be clear that the present invention is not limited to these embodiments only. Numerous modifications, changes, variations, substitutions and equivalents will be apparent to those skilled in the art, without departing from the spirit and scope of the present invention, as described in the claims.

What is claimed is:

1. A system for cross-coupling data manipulating actions executed in platforms of disparate equipment format to synchronously display disparate representations of an electronic design respectively thereat, the system comprising:
    at least first and second platforms having different equipment format, said first platform being programmably configured to execute a first collection of tools compatible with a first data representation format, said first collection of tools executing actions for selectively displaying at least a portion of the electronic design at the first platform;
    said second platform being programmably configured to execute a second collection of tools compatible with a second data representation format, said second collection of tools executing actions for selectively displaying said portion of the electronic design at the second platform; and
    a synchronizing controller coupled to said first and second platforms for selectively connecting at least one of the tools in said first collection with a corresponding one of the tools in said second collection to define a connected pair of tools, said synchronizing controller automatically interpreting a display control action actuated by one of said connected tools at one of said platforms to concurrently actuate a matching display control action by the other of said connected tools at the other of said platforms upon determination of a synchronization event supported by the connected tools;
    wherein said first and second platforms of disparate equipment format are bi-directionally linked for direct mutual control through said connected tools, each replicating substantially simultaneously a display control action executed by the other, said first and second platforms thereby synchronously displaying disparate representations of the electronic design to establish respectively thereat disparate viewing frames including graphically dissimilar abstractions for the same portion of the electronic design;
    whereby actions for locally displaying differently formatted representations of the same electronic design portion at platforms of different equipment format are bi-directionally synchronized; and, wherein the actions comprise changing said viewing frame displayed for an abstraction of said portion of the electronic design at one of said platforms for synchronized change of said disparate viewing frame displayed for a dissimilar abstraction at the other of said platforms.

2. The system as recited in claim 1, wherein said first platform includes a circuit layout editor, and said second platform includes a circuit pattern data viewer.

3. The system as recited in claim 1, wherein said action of each said connected tool is actuated responsive to either of a direct-user input message at the platform corresponding thereto or an action of the other said connected tool actuated at the other platform.

4. The system as recited in claim 3, wherein bi-directional communication is maintained by said synchronizing controller according to Mutual-exclusion object (MUTEX) to prevent simultaneous conflicting actuation of one of said connected tools.

5. The system as recited in claim 2, wherein said circuit pattern data viewer is compatible with at least one IC mask layout data format.

6. The system as recited in claim 5, wherein said IC mask layout data format comprises one of a plurality of industry standard equipment and transport formats, including GDSII, MEBES, and OASIS database formats.

7. The system as recited in claim 1, wherein said synchronizing controller is disposed external to said connected tools.

8. The system as recited in claim 1, wherein each of said connected tools includes said synchronizing controller.

9. The system as recited in claim 2, wherein said synchronizing controller bi-directionally links a plurality of layout databases with a plurality of said circuit pattern data viewers compatible with different mask database formats in manufacturing equipment; wherein the manufacturing equipment comprises one or more of: a mask, reticle, or wafer manufacturing and test equipment; the manufacturing equipment including scanning equipment, microscopes, wafer map machines, and IC test machines.

10. A method for cross-coupling data manipulating actions executed in platforms of disparate equipment format to synchronously display disparate representations of an electronic design respectively thereat, the method comprising:
    establishing at least first and second platforms having different equipment format,
    programmably configuring said first platform to execute a first collection of tools compatible with a first data representation format, said first collection of tools executing actions for selectively displaying at least a portion of the electronic design at the first platform;
    programmably configuring said second platform to execute a second collection of tools compatible with a second data representation format, said second collection of tools executing actions for selectively displaying said portion of the electronic design at the second platform;
    establishing a synchronizing controller coupled to said first and second platforms;
    executing said synchronizing controller for selectively connecting at least one of the tools in said first collection with a corresponding one of the tools in said second collection to define a connected pair of tools; and
    executing said synchronizing controller to automatically interpret a display control action actuated by one of said connected tools at one of said platforms to concurrently actuate a matching display control action by the other of said connected tools at the other of said platforms upon determination of a synchronization event supported by the connected tools;
    wherein said first and second platforms of disparate equipment format are bi-directionally linked for direct mutual control through said connected tools, each replicating substantially simultaneously a display control action executed by the other, said first and second platforms thereby synchronously displaying disparate representations of the electronic design to establish respectively thereat disparate viewing frames including graphically dissimilar abstractions for the same portion of the electronic design;

whereby actions for locally displaying differently formatted representations of the same electronic design portion at platforms of different equipment format are bi-directionally synchronized; and, wherein the actions comprise changing said viewing frame displayed for an abstraction of said portion of the electronic design at one of said platforms for synchronized change of said disparate viewing frame displayed for a dissimilar abstraction at the other of said platforms.

11. The method as recited in claim 10, wherein said action of each said connected tool is actuated responsive to either of a direct-user input message at the platform corresponding thereto or an action of the other said connected tool actuated at the other platform.

12. The method as recited in claim 10, wherein an action actuated responsive to the direct-user input message further comprises:

processing a request made by the user;

updating an environment of said connected tool; and checking whether the actions in response to the direct-user input message result in a synchronization event.

13. The method as recited in claim 12, wherein upon the direct-user input message indicating a synchronization event:

formatting a request; and, sending the formatted request to the other of said connected tools.

14. The method as recited in claim 10, wherein said automatically interpreting an action of one said connected tool for the other comprises:

interpreting a message from a first of said connected tools;

translating the interpreted message into an interpretable message format corresponding to a second of said connected tools; and, checking whether the translated message indicates a synchronization event.

15. The method as recited in claim 14, wherein: if the translated message indicates a synchronization event, then:

processing the request made by said first of the connected tools; and updating an environment of said first of the connected tools.

16. The method as recited in claim 10, further comprising selecting at least one of a plurality of IC mask layout data formats and displaying said different representation of said electronic design portion as a planar geometric mask display.

17. The method as recited in claim 16, wherein said first platform includes a circuit layout editor, and said second platform includes a circuit pattern data viewer compatible with at least one of said IC mask layout data formats, said IC mask layout data formats comprise a plurality of industry standard equipment and transport formats, including GDSII, MEBES, and OASIS database formats.

18. The method as recited in claim 10, wherein bi-directional communication is maintained by said synchronizing controller according to Mutual-exclusion object (MUTEX) to prevent simultaneous conflicting actuation of one of said connected tools.

19. A computer program product for cross-coupling data manipulating actions executed in platforms of disparate equipment format to synchronously display disparate representations of an integrated circuit (IC) design respectively thereat, the computer program product comprising a non-transitory computer readable medium having program instructions for:

establishing at least one IC layout editor platform and at least one pattern data viewer platform, said IC layout editor and pattern data viewer platforms being different in equipment format, configuring said IC layout editor platform to execute a first collection of tools compatible with an IC layout data representation format, said first collection of tools executing actions for selectively displaying at least a portion of the IC design at said IC layout editor platform;

configuring said pattern data viewer platform to execute a second collection of tools compatible with an IC mask layout data representation format, said second collection of tools executing actions for selectively displaying said portion of the IC design at said pattern data viewer platform;

establishing a synchronizing controller interface coupled to said platforms;

executing said synchronizing controller interface for selectively connecting at least one of the tools in said first collection with a corresponding one of the tools in said second collection to define a connected pair of tools; and executing said synchronizing controller interface to automatically interpret a display control action actuated by one of said connected tools at either of said platforms to concurrently actuate a matching display control action by the other of said connected tools at the other of said platforms upon determination of a synchronization event supported by the connected tools;

wherein said IC layout editor and pattern data viewer platforms of disparate equipment format are bi-directionally linked for direct mutual control through said connected tools, each replicating substantially simultaneously a display control action executed by the other, said platforms thereby synchronously displaying disparate representations of the IC design to establish respectively thereat disparate viewing frames including graphically dissimilar abstractions for the same portion of the IC design;

whereby actions for locally displaying differently formatted representations of the same IC design portion at said platforms of different equipment format are bi-directionally synchronized; and, wherein the actions comprise changing said viewing frame displayed for an abstraction of said portion of the IC design at one of said platforms for synchronized change of said disparate viewing frame displayed for a dissimilar abstraction at the other of said platforms.

20. The computer program product as recited in claim 19, wherein said IC layout editor platform is actuated to define a baseline of the IC design in said IC layout data representation format, and said pattern data viewer platform is actuated to define an IC mask layout corresponding to a portion of the IC design for comparative reference to said baseline.

* * * * *